United States Patent [19]

Charache et al.

[11] Patent Number: 5,753,050
[45] Date of Patent: May 19, 1998

[54] THERMOPHOTOVOLTAIC ENERGY CONVERSION DEVICE

[75] Inventors: Greg W. Charache; Paul F. Baldasaro, both of Clifton Park; James L. Egley, Burnt Hills, all of N.Y.

[73] Assignee: The United States of America as represented by the Department of Energy, Washington, D.C.

[21] Appl. No.: 703,156

[22] Filed: Aug. 29, 1996

[51] Int. Cl.$^6$ .................. H01L 31/06; H01L 31/18
[52] U.S. Cl. ............. 136/255; 136/253; 136/259; 136/262; 257/436; 438/77; 438/87
[58] Field of Search ................ 136/253, 255, 136/259, 262; 257/436; 438/72, 87

[56] References Cited

U.S. PATENT DOCUMENTS

| | | | |
|---|---|---|---|
| 4,764,104 | 8/1988 | Nelson | 431/100 |
| 5,407,491 | 4/1995 | Freunduch et al. | 136/249 |
| 5,626,687 | 5/1997 | Campbell | 136/259 |

OTHER PUBLICATIONS

H. Köstlin et al., "Thin–Film Reflection Filters", Philips Tech. Review, 41, 225, (1983).
P.F. Baldasaro et al., "Experimental Assessment of Low Temperature Voltaic Energy Conversion", AIP Conference Proceedings, 321, 29 (1995).
J.C. Zolper et al., "GaAsSb–Based Heterojunction Tunnel Diodes for Tandem Solar Cell Interconnects", First WCPEC, 1994, pp. 1843–1846.
M.P. Mikhailova et al., "Type II Heterojunction in the GaInAsSb/GaSb System", Semiconductor Science Technology, 9, (1994), pp. 1279–1295.
E. Yablonovich et al., "Extreme Selectivity in the Lift–Off of Epitaxial GaAs Films", Applied Physics Letters 51, 2222, (1987).
D.M. Wilt et al., "Peeled Film GaAs Solar Cell Development", IEEE PVSC, 111, (1990).
R.W. McClelland et al., "A Technique for Producing Epitaxial Films on Reusable Substrates", Applied Physics Letters 37, 560, (1980).
R.P. Gale et al., "High Efficiency Thin Film AlGaAs–GaAs Double Heterojunction Solar Cells", IEEE PVSC, 446, (1988).
G.B. Lush et al., "Thin Film GaAs Solar Cells by Epitaxial Lift–off", IEEE PVSC, 1343, (1993).

*Primary Examiner*—Aaron Weisstuch
*Attorney, Agent, or Firm*—Virginia B. Caress; William R. Moser; Paul A. Gottlieb

[57] ABSTRACT

A thermophotovoltaic device and a method for making the thermophotovoltaic device. The device includes an n-type semiconductor material substrate having top and bottom surfaces, a tunnel junction formed on the top surface of the substrate, a region of active layers formed on top of the tunnel junction and a back surface reflector (BSR). The tunnel junction includes a layer of heavily doped n-type semiconductor material that is formed on the top surface of the substrate and a layer of heavily doped p-type semiconductor material formed on the n-type layer. An optional pseudomorphic layer can be formed between the n-type and p-type layers. A region of active layers is formed on top of the tunnel junction. This region includes a base layer of p-type semiconductor material and an emitter layer of n-type semiconductor material. An optional front surface window layer can be formed on top of the emitter layer. An optional interference filter can be formed on top of the emitter layer or the front surface window layer when it is used.

18 Claims, 1 Drawing Sheet

THERMOPHOTOVOLTAIC ENERGY CONVERSION DEVICE

RIGHTS OF THE GOVERNMENT

The United States government has rights in this invention pursuant to contract DE-AC12-76N00052, awarded by The Department of Energy.

BACKGROUND OF THE INVENTION

1. Field of Invention

The present invention relates to the field of thermophotovoltaic (TPV) direct energy conversion. In particular, the present invention relates to a TPV device having an improved conversion efficiency and to a method for making the TPV device.

2. Description of the Related Art

Thermophotovoltaic (TPV) energy systems convert thermal energy to electric power using the same principle of operation as solar cells. In particular, a heat source radiatively emits photons that are incident on a semiconductor TPV cell. Photons with an energy greater than the semiconductor bandgap ($E_g$) excite electrons from the valence band to the conduction band (interband transition). The resultant electron-hole-pairs (ehp) are then collected by metal contacts which can power an electrical load. Any series resistance intrinsic to the cell and the contacts is lost as a provider of energy to the load, and any photons having an energy less than $E_g$ may be parasitically absorbed as heat. In order to increase the efficiency of a TPV energy system, both the parasitic resistance and free-carrier absorption should be minimized. Additionally, some form of spectral control should be employed for reflecting the photons having energy less than $E_g$ back to the heat source.

There are several sources of resistance in a TPV device, for example, resistance through the emitter, resistance of the base and emitter contacts, resistance of the substrate regions, and resistance through the metal fingers and bus bar. The large spacing between the fingers on the emitter, typically on the order of 100's of μm's, causes the resistivity in this region to be a concern if carrier mobility in this region is too low. The thickness of the substrate, typically on the order of 600 μm, can also introduce a large series resistance for the same reason. The mobility of electrons in III–V compound semiconductor materials is, in general, from one to two orders of magnitude greater than the mobility of holes. Thus, n-type semiconductor material or heavily doped p-type semiconductor material regions should be used wherever possible for minimizing series resistance.

To a first order approximation, a semiconductor is transparent to photons having energies less than $E_g$, the bandgap energy of the semiconductor. However, electrons in the conduction band and holes in the valence band can be excited to higher energy states within their respective bands by long-wavelength photons, that is, photons having energies below the bandgap of the semiconductor. The probability of parasitic absorption of the long-wavelength photons increases with the thickness of the substrate. These intraband transitions are referred to as free-carrier absorptions and result in a loss of the below-bandgap long-wavelength photons or light. This process is characterized by a free carrier absorption coefficient ($\alpha_F$) that is generally proportional to the semiconductor doping level and the square of the wavelength. Free-carrier absorption by the holes in III–V compound materials is generally at least one order of magnitude larger than that for the electrons, as described by J. I. Pankove, *Optical Processes in Semiconductors*, Prentice Hall, Englewood Cliffs, N.J., 1971. For this reason it is desirable to have an n-type material wherever the below-bandgap light travels for long distances.

Improvement in TPV device conversion efficiency by spectral control has been attempted by three different approaches. In the first approach, the emission spectrum of the thermal radiator is modified for suppressing emission of below-bandgap energy photons. Several techniques have been tried including surface texturing and rare earth oxide coatings on refractory metal, as described in U.S. Pat. No. 4,746,104 to Nelson. Unfortunately, the high operating temperature and low emissivity of these kinds of radiators presently limit their applicability.

In the second approach, selective filters are positioned between a TPV cell and a radiator. The selective filters are designed for transmitting most of the above-bandgap light and reflecting most of the below-bandgap light back to the radiator for recycling, as disclosed by H. Kostlin et al., "Thin-film Reflection Filters", Philips Tech. Rev., 41,225 (1983). Unfortunately, this form of spectral control introduces unwanted absorption of both above- and below-bandgap light, lowering both efficiency and power density of a TPV cell. Further, only a fraction of the below-bandgap photons are reflected for recycling.

In the third approach, a highly reflective coating is applied to the back of a TPV cell for forming a back surface reflector (BSR). Most of the above-bandgap energy is absorbed in the active region of the cell, while the below-bandgap energy passes through the cell where it is reflected and is returned to the radiator after passing through the cell for a second time, provided the below-bandgap energy is not absorbed by free-carriers in the substrate, as described by R. M. Swanson, *Silicon Photovoltaic Cells in TPV Conversion*, EPRI Project 790-2, Interim Report ER-1271, 1979. This approach of spectral control has the highest intrinsic spectral utilization factor, as described by P. F. Baldasaro et al., Experimental Assessment of Low Temperature Voltaic Energy Conversion, AIP Conf. Proc., 321, 29 (1995).

Thus, the ideal back surface reflector TPV cell has low parasitic losses due to low series resistance and low free carrier absorption. In order to achieve this, both the resistivity and free-carrier absorption in the emitter and substrate must be minimized. Lastly, assuming that the below-bandgap light is not absorbed by the substrate, a BSR must be employed to reflect below-bandgap light back to the source. Conventional TPV cell design uses an emitter, and base/substrate combination, one of which must be a p-type material and the other an n-type material. Using a p-type material for the base/substrate combination degrades performance based on free-carrier absorption characteristics, while doping the emitter to be a p-type material degrades performance because of an increased series resistance. In other words, any design that minimizes the number of acceptors in a TPV device will help to maximize efficiency.

SUMMARY OF THE INVENTION

The present invention provides an alternative design for a TPV energy conversion device that minimizes both series resistance and below-bandgap parasitic losses by reducing resistance of the device, by reducing the number of p-type regions in the device and by integrating a BSR spectral control device into the TPV cell.

The present invention produces a thermophotovoltaic device including a substrate that has a top surface and a bottom surface and is formed from an n-type semiconductor material. A number of semiconductor layers are grown on the top layer of the substrate. These layers in order of growth sequence are: graded layers, $N^+$ layer, a pseudomorphic layer, a $p^+$ layer, a back surface field layer, a P-base layer, an $N^+$ emitter layer and a front surface window layer. The graded layers, pseudomorphic layer, back surface field layer and front surface window layer are optional. The $N^+$ layer, pseudomorphic layer, and $P^+$ layer collectively form the tunnel junction. The P-base layer and $N^+$ emitter layer collectively form the region of active layers. The $N^+$ layer, $P^+$ layer and $N^+$ emitter layers are all heavily doped. Preferably, the substrate is a high bandgap material and the P-base layer and $N^+$ emitter layers are low bandgap material. A back surface reflector is formed on the bottom surface of the substrate An optional interference filter can also be deposited on the top surface of the $N^+$ emitter layer or the optional front surface window layer.

The present invention also provides a method of making a thermophotovoltaic device. The method includes the step of forming a substrate from an n-type semiconductor material, the substrate having a top surface and bottom surface. The method further involves growing a number of semiconductor layers using well-known epitaxial growth techniques on the top layer of the substrate. These layers in order of growth sequence are: graded layers, an $N^+$ layer, a pseudomorphic layer, a $P^+$ layer, a back surface field layer, a P-base layer, an $N^+$ emitter layer and a front surface window layer. The graded layers, pseudomorphic layer, back surface field layer and front surface window layer are optional. The $N^+$ layer, pseudomorphic layer, and $P^+$ layer collectively form the tunnel junction. The P-base layer and $N^+$ emitter layer collectively form the region of active layers. The $N^+$ layer, $P^+$ layer and $N^+$ emitter layers are all heavily doped using conventional doping techniques. Preferably, the substrate is a high bandgap material and the P-base layer and $N^+$ emitter layers are low bandgap material. According to the invention, a back surface reflector is formed by depositing a highly reflective metal layer on the bottom surface of the substrate. An optional interference filter can also be deposited on the top surface of the $N^+$ emitter layer or the optional front surface window layer.

BRIEF DESCRIPTION OF THE DRAWING

The various features of the present invention, together with other advantages and benefits which may be attained by its use, will become more apparent in view of the following detailed description of the invention taken in conjunction with the sole FIGURE which shows a TPV cell having a substrate, a tunnel junction, a region of active layers and a back surface reflector according to the present invention.

DETAILED DESCRIPTION OF THE PREFERRED EMBODIMENTS

Figure 1:
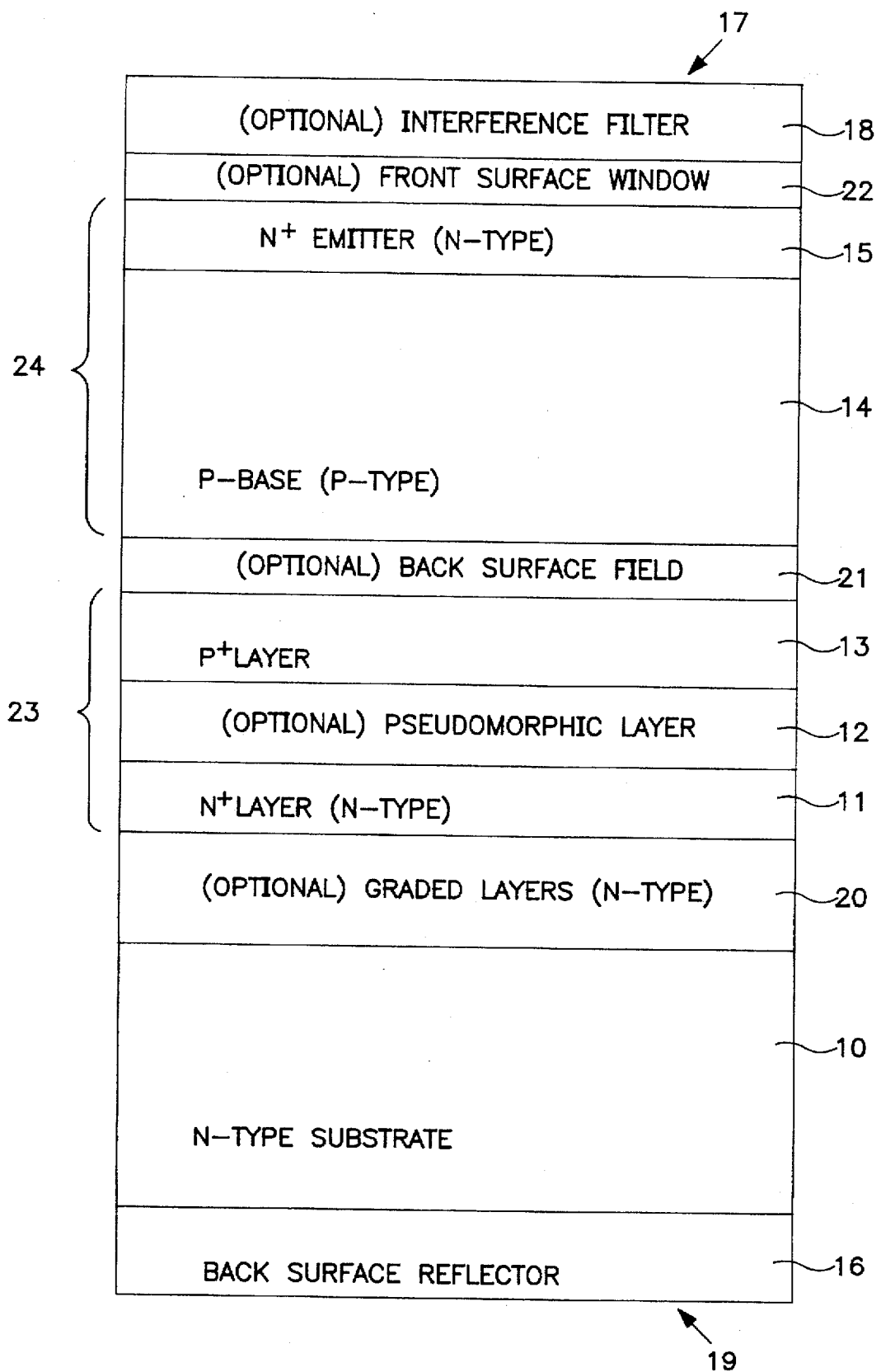

The sole FIGURE shows a TPV energy conversion device formed from a substrate, a tunnel junction, a region of active layers, and a back surface reflector (BSR). The region of active layers includes a P-base layer and an $N^+$ emitter layer. The emitter resistance of the device of the FIGURE is minimized by doping the $N^+$ emitter layer to be an n-type semiconductor material. The P-base layer of the TPV device is a p-type semiconductor material. A low resistance contact to the substrate is formed by a tunnel junction between the P-base layer and the substrate. The high electron mobility characteristic of the n-type substrate provides the advantage of decreasing the resistance of the substrate. The term tunnel junction as used throughout this disclosure includes band-to-band tunneling in homojunctions and type-II broken gap heterojunctions. Free-carrier absorption is reduced by using an n-type substrate semiconductor material. Conversion efficiency is maximized by reflecting unused photons back to the source by the BSR.

The TPV device of the FIGURE includes a substrate 10 formed from an n-type semiconductor material that may be any good conductor that can make good electrical contract to the active layer.

Substrate 10 could be used only for a support if electrical contact is made in other ways. A tunnel junction 23 consisting of $N^+$ layer 11, optional pseudomorphic layer 12, and $P^+$ layer 13 is formed on the top surface of the substrate. An $N^+$ layer 11 of heavily doped n-type semiconductor material is grown on the top surface of the substrate. An optional pseudomorphic layer 12 can be grown on top of the $N^+$ layer 11. The pseudomorphic layer 12 is a thin layer of an n-type or p-type semiconductor material that is used to enhance the tunneling effect of the tunnel junction. This layer 12 may or may not be lattice-matched to the $N^+$ layer 11 or $P^+$ layer 13. However, if it is lattice-mismatched then its thickness must be below a critical thickness to not introduce misfit dislocations (i.e., pseudomorphic). The pseudomorphic layer 12 would not be present if a type II, broken gap heterojunction, or a simple heavily doped tunnel junction were used or if the series resistance of the tunnel junction is negligible. To complete the tunnel junction, a $P^+$ layer 13 of heavily doped p-type semiconductor material is grown on top of the $N^+$ layer 11 or the optional pseudomorphic layer 12 if it exists. A region of active layers 24 consisting of a P-base layer 14 and a $N^+$ emitter layer 15 is formed on top of the tunnel junction. A P-base layer 14 is formed on top of the $P^+$ layer of the tunnel junction. An $N^+$ emitter layer 15 is grown on top of the P-base layer 14. The active layers may be formed from any appropriate TPV cell material. A highly reflective metal layer 16 is formed on the bottom surface of substrate 10. This layer 16 forms the back surface reflector.

Optional graded layers 20 of n-type semiconductor materials can be grown on the top surface of substrate 10 between the substrate and the tunnel junction. Graded layers 20 are used to gradually change the lattice constant from that of the substrate to that of the P-base layer 14 and $N^+$ emitter 15 layer. The graded layers 20 would not be used if the lattice constant of the substrate 10 and the P-base 14 are the same.

An optional back surface field layer 21 can be grown on top of the $P^+$ layer 13 of the tunnel junction between the junction and the P-base layer 14 of the region of active layers. The back surface field layer 21 is lattice-matched to the P-base layer 14. The back surface field layer 21 is used to increase the quantum efficiency of the TPV device.

An optional front surface window layer 22 can be grown on top of the $N^+$ emitter layer 15 to reduce front surface recombination velocity.

An optional interference filter 18 may be deposited on top of the front surface window layer to improve the spectral control of the TPV device.

There are several possibilities for materials for fabricating a tunnel junction according to the invention, of which two are preferable. The conventional way of fabricating a tunnel junction is to heavily dope both sides of a p-n junction This causes the band bending to be so extreme that the conduction band states lie at the same point in the energy space as the valence band states. Thus, electrons are able to travel directly from the conduction band of the $N^+$ layer 11 to the valence band of the $P^+$ layer 13 by tunneling through the bandgap. The tunneling probability, which can be directly related to the junction resistance is then a function of the doping on both sides of the junction and the bandgap of the material. This approach works better for low-bandgap material based on the exponential dependence of tunnelling probability on bandgap and the low bandgap materials employed for TPV devices. However, a thin pseudomorphic layer 12 of a different material placed between a p-n junction of layers 13 and 11 can significantly enhance the tunnelling probability for certain combinations of band alignments, as described by J. C. Zopler et al., *GaAsSb-Based Heterojunction Tunnel Diodes for Tandem Solar Cell Interconnects*, First WCPEC, 1994, pp. 1843–1846. This approach is preferable for a TPV application because of the close relationship between device performance and series resistance. Another possibility is a type II, broken gap heterojunction. For example, M. P. Mikhailova et al., Type II Heterojunction in the GaInAsSb/GaSb System, Semicond. Sci. Technol., 9 (1994), pp. 1279–1295, disclose that a $GaSb/Ga_{0.89}In_{0.09}Sb_{0.91}$, p-n heterojunction is ohmic.

Fabrication of a TPV device according to the present invention is straightforward and follows conventional solar cell/TPV processing. A typical fabrication sequence includes forming a substrate 10 from an n-type semiconductor material, forming a tunnel junction on the top surface of the substrate 10, and forming a region of active layers on top of the tunnel junction. If the optional graded layers 20 are used, several n-type conductor layers are grown epitaxially on the top surface of the substrate prior to forming the tunnel junction. A tunnel junction is formed by growing a heavily doped n-type semiconductor layer $N^+$ 11 on the top surface of substrate 10 (or on the graded layers 20 when used), and growing a heavily doped p-type semiconductor layer $P^+$ 13 on the N layer 11. If the optional pseudomorphic layer 12 is used, layer 12 is grown on 11. The region of active layers is formed by growing a p-type semiconductor layer P-base 14 on top of the tunnel junction and a heavily doped n-type semiconductor layer $N^+$ emitter 15 on layer 14. Layers 11–13 of the tunnel junction and layers 14–15 of the region of active layers are grown using any well-known epitaxial growth technique. Layers 11, 13 and 15 are heavily doped using well-known techniques. An optional n-type semiconductor back surface field layer 21 is grown epitaxially on the $P^+$ layer 13 of the tunnel junction. An optional front surface window layer is grown epitaxially on the $N^+$ emitter layer of the region of active layers. The front side of the TPV device is metalized and a grid pattern is defined using conventional photolithography and the active areas are then mesa-etched (not shown). A front-side 17 interference filter 18 is deposited and contact holes are etched down to a bus bar (not shown). A highly reflective metal layer 16 is deposited on the bottom surface of a substrate 10 (which is also the backside of the TPV cell 19). Fabricating, a TPV device in this manner combines a spectral control device and a TPV cell into a unified structure. The deleterious effects of holes are reduced by minimizing the number of acceptors and the parasitic absorption of front-side plasma filters is eliminated. Low energy photons are reflected over a broader range of energies than conventional stand-alone interference or plasma filters.

While the present invention has been described in connection with the illustrated embodiments, it will be appreciated and understood that modifications may be made without departing from the true spirit and scope of the invention.

What is claimed is:

1. A thermophotovoltaic energy conversion device comprising:

a substrate formed from an n-type semiconductor material, the substrate having a top surface and bottom surface;

a tunnel junction formed on the top surface of the substrate, the tunnel junction having a top surface;

a region of active layers formed on the top surface of the tunnel junction; and a back surface reflector formed on the bottom surface of the substrate.

2. A thermophotovoltaic energy conversion device according to claim 1, wherein the tunnel junction has two layers, a layer of heavily doped n-type semiconductor material formed on the top surface of the substrate and a layer of heavily doped p-type semiconductor material formed on top of the heavily doped n-type semiconductor material layer.

3. A thermophotovoltaic energy conversion device according to claim 2, wherein the tunnel junction includes a pseudomorphic layer of n-type or p-type semiconductor material formed between the heavily doped n-type semiconductor material and the heavily doped p-type material.

4. A thermophotovoltaic energy conversion device according to claim 1, wherein the region of active layers has two layers, a base layer of p-type semiconductor material formed on the top surface of the tunnel junction and an emitter layer of n-type semiconductor material formed on top of the base layer.

5. A thermophotovoltaic energy conversion device according to claim 3, wherein a front surface window layer is formed on top of the emitter layer of the region of active layers.

6. A thermophotovoltaic energy conversion device according to claim 5, wherein an interference filter is formed on top of the front surface window layer.

7. A thermophotovoltaic energy conversion device according to claim 3, wherein an interference filter is formed on top of the emitter layer of the region of active layers.

8. A thermophotovoltaic energy conversion device according to claim 1 wherein graded layers of n-type semiconductor material are formed on the top surface of the substrate between the substrate and the tunnel junction.

9. A thermophotovoltaic energy conversion device according to claim 1, wherein a back surface field layer of n-type semiconductor material is formed on the top surface of the tunnel junction between the tunnel junction and the region of active layers.

10. A method of making a thermophotovoltaic energy conversion device, the method comprising the steps of:

forming a substrate from an n-type semiconductor material, the substrate having a top surface and a bottom surface;

forming a tunnel junction on the top surface of the substrate, the tunnel junction having a top surface;

forming a region of active layers on the top surface of the tunnel junction; and forming a back surface reflector on the bottom surface of the substrate.

11. The method according to claim 10, wherein the tunnel junction is formed using the step of forming two layers, a layer of heavily doped n-type semiconductor material being formed on the top surface of the substrate and a layer of heavily doped p-type semiconductor material being formed on top of the heavily doped n-type semiconductor material layer.

12. A method according to claim 11, wherein the tunnel junction is formed using the step of forming a pseudomorphic layer of n-type or p-type semiconductor material between the heavily doped layer of n-type semiconductor material and the heavily doped layer of p-type semiconductor material.

13. The method according to claim 10, wherein the region of active layers is formed using the step of forming two layers, a base layer of p-type semiconductor material being formed on the top surface of the tunnel junction and an emitter layer of n-type semiconductor material being formed on top of the base layer.

14. A method according to claim 10, further comprising the step of forming graded layers of n-type semiconductor materials on the top surface of the substrate between the substrate and the tunnel junction.

15. A method according to claim 10, further comprising the step of forming a back surface field layer of an n-type semiconductor material on the top surface of the tunnel junction between the tunnel junction and the region of active layers.

16. A method according to claim 10, wherein the region of active layers includes an emitter layer, the method further comprising the step of forming an interference filter on top of the emitter layer.

17. A method according to claim 10, wherein the region of active layers includes an emitter layer, the method further comprising the step of forming a front surface window layer on top of the emitter layer.

18. A method according to claim 17, further comprising the step of forming an interference filter on top of the front surface window layer.

* * * * *